(12) United States Patent
Zhang et al.

(10) Patent No.: US 11,894,420 B2
(45) Date of Patent: Feb. 6, 2024

(54) MEMORY AND FORMATION METHOD THEREOF

(71) Applicant: CHANGXIN MEMORY TECHNOLOGIES, INC.

(72) Inventors: Qiang Zhang, Hefei (CN); Zhan Ying, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 210 days.

(21) Appl. No.: 17/386,492

(22) Filed: Jul. 27, 2021

(65) Prior Publication Data

US 2021/0359084 A1   Nov. 18, 2021

Related U.S. Application Data

(63) Continuation of application No. PCT/CN2020/104961, filed on Jul. 27, 2020.

(30) Foreign Application Priority Data

Nov. 8, 2019 (CN) .......................... 201911087493.6

(51) Int. Cl.

| H01L 29/06 | (2006.01) |
|---|---|
| H01L 21/762 | (2006.01) |
| H01L 27/105 | (2023.01) |
| H10B 99/00 | (2023.01) |

(52) U.S. Cl.
CPC .... *H01L 29/0649* (2013.01); *H01L 21/76224* (2013.01); *H01L 27/105* (2013.01); *H10B 99/00* (2023.02)

(58) Field of Classification Search
CPC ............. H01L 27/105; H01L 21/76224; H01L 21/308; H01L 29/0649; H10B 12/09; H10B 99/00
USPC ........................................... 257/368; 438/199
See application file for complete search history.

(56) References Cited

U.S. PATENT DOCUMENTS

| 9,704,816 B1 * | 7/2017 | Huang ................. H01L 21/461 |
| 2012/0171867 A1 | 7/2012 | Kim |
| 2015/0091127 A1 | 4/2015 | Lee et al. |
| 2016/0233297 A1 | 8/2016 | Tomoyama |

(Continued)

FOREIGN PATENT DOCUMENTS

| CN | 1617327 A | 5/2005 |
| CN | 107818980 A | 3/2018 |

(Continued)

*Primary Examiner* — Thinh T Nguyen
(74) *Attorney, Agent, or Firm* — Kilpatrick Townsend & Stockton LLP

(57) ABSTRACT

A memory formation method includes: providing a substrate; forming a first mask layer on the substrate, in the first mask layer there being formed a plurality of parallel-arranged strip-shaped patterns positioned above the array area, and an end of each of the strip-shaped patterns being connected to the first mask layer on the peripheral area of the substrate; forming a second mask layer on the first mask layer, in the second mask layer there being formed a plurality of first patterns; and etching layer by layer by using the second mask layer and the first mask layer as masks to transfer the strip-shaped patterns and the first patterns into the substrate to form the discrete active areas arranged in an array.

12 Claims, 8 Drawing Sheets

(56) References Cited

U.S. PATENT DOCUMENTS

2017/0025420 A1   1/2017   Park et al.
2019/0139767 A1   5/2019   Shin

FOREIGN PATENT DOCUMENTS

CN   207503954 U   6/2018
CN   210607188 U   5/2020

* cited by examiner

MEMORY AND FORMATION METHOD THEREOF

CROSS REFERENCE

This application is a continuation of PCT/CN2020/104961, filed on Jul. 27, 2020, which claims priority to Chinese Patent Application No. 201911087493.6, titled "MEMORY AND FORMATION METHOD THEREOF" and filed on Nov. 8, 2019, the entire contents of which are incorporated herein by reference.

TECHNICAL FIELD

The present disclosure relates to the field of memory technologies, and more particularly, to a memory and a formation method thereof.

BACKGROUND

A memory includes a plurality of memory cells arranged in an array, and each of the memory cells is formed on an active area (AA). In the process of forming the memory in the existing technologies, generally it is required to etch a substrate to form the active areas arranged in an array.

As a storage capacity of the memory increases, a storage density increases, and a line width of the active area gradually shrinks. When a plurality of mask patterns arranged in an array are formed on a surface of the substrate to serve as a mask of the active area, a self-aligned double patterning (SADP) process is required to form an AA mask with a smaller line width pattern to form a strip-shaped AA. Next, a shallow trench isolation (STI) mask is formed on the AA mask to cut off the strip-shaped AA to form the active areas arranged in an array.

When the SADP process is employed to form the active area of an array area of the memory, a size of the formed active area is very small because the size of the AA mask is small, and thus an edge of an active area array may have problems such as collapse and stress, which may have a negative effect on product yield.

How to improve the edge problem of the active area array of the memory is a problem to be solved urgently at present.

SUMMARY

A technical problem to be solved by the present disclosure is to provide a memory and a formation method thereof which can improve an edge problem of an active area array of a memory.

To solve the above problem, the present disclosure provides a method for forming a memory. The formation method includes: providing a substrate, which includes an array area and a peripheral area encircling the array area; forming a first mask layer on the substrate, wherein in the first mask layer there is formed a plurality of parallel-arranged strip-shaped patterns positioned above the array area, an end of each of the strip-shaped patterns is connected to the first mask layer on the peripheral area of the substrate to form, in the array area of the substrate, a plurality of strip-shaped continuous active areas arranged in parallel, and an end of each of the continuous active areas is connected to the peripheral area of the substrate; forming a second mask layer on the first mask layer, wherein in the second mask layer there is formed a plurality of first patterns, the plurality of first patterns are arranged in an array and are overlapped with the strip-shaped patterns to form a division trench in the substrate to divide the continuous active area into a plurality of discrete active areas; and etching layer by layer by using the second mask layer and the first mask layer as masks to transfer the strip-shaped patterns and the first patterns into the substrate to form the discrete active areas arranged in an array, wherein an end of the discrete active area at an inner edge of the array area is connected to the peripheral area of the substrate.

In some embodiments, the method for forming the strip-shaped patterns includes: forming a third mask layer on the unpatterned first mask layer, wherein in the third mask layer there is formed a plurality of discrete and strip-shaped initial patterns arranged in parallel; forming a fourth mask layer on the third mask layer, wherein the fourth mask layer covers the peripheral area of the third mask layer and covers an end of the strip-shaped initial pattern; etching the first mask layer by using the fourth mask layer and the third mask layer as masks, wherein a strip-shaped pattern is formed in the first mask layer, and an end of the strip-shaped pattern is connected to the peripheral area of the first mask layer; and removing the third mask layer and the fourth mask layer.

In some embodiments, a second pattern positioned on the peripheral area of the substrate and encircling the strip-shaped pattern is further formed in the second mask layer, wherein the second pattern is configured for forming, in the peripheral area of the substrate, a peripheral trench encircling the array area.

In some embodiments, there is a certain spacing between the second pattern and the outermost first pattern.

In some embodiments, a sidewall of the peripheral trench facing toward a side of the array area is a curved surface.

In some embodiments, the formation method further includes: filling an insulating material in the division trench and the peripheral trench to form a shallow trench isolation structure.

In some embodiments, there is a straight edge in a portion of the fourth mask layer covering the end of the strip-shaped initial pattern.

To solve the above problem, the technical solution of the present disclosure also provides a memory, which includes: a substrate including an array area and a peripheral area encircling the array area; and a plurality of discrete active areas arranged in an array and positioned in the array area of the substrate. An end of the discrete active area at an edge of the array area is connected to the peripheral area of the substrate. The discrete active areas are isolated by a shallow trench isolation structure.

In some embodiments, a peripheral shallow trench isolation structure is formed in the peripheral area of the substrate, and the peripheral shallow trench isolation structure encircles the array area.

In some embodiments, there is a certain spacing between the peripheral shallow trench isolation structure and the array area.

In some embodiments, a sidewall of the peripheral shallow trench isolation structure facing toward a side of the array area is a curved surface.

In some embodiments, the shallow trench isolation structure includes a first shallow trench isolation structure and a second shallow trench isolation structure. The first shallow trench isolation structure is strip-shaped and divides the array area into a plurality of strip-shaped continuous active areas arranged in parallel. The second shallow trench isolation structure is block-shaped and divides the strip-shaped continuous active area into a plurality of discrete active areas.

In some embodiments, end surfaces of the first shallow trench isolation structure on the same side of the array area are flush.

According to the method for forming a memory provided by the present disclosure, an end of a continuous active area is connected to the peripheral area in the process of forming the strip-shaped continuous active area, such that a discrete active area at an edge of the array area may be prevented from collapsing after the continuous active area is divided into a plurality of discrete active areas. Furthermore, stress effects applied by the peripheral structure to the discrete active area at the edge of the array area may be released, and the reliability of the memory may be improved.

DETAILED DESCRIPTION

Embodiments of a memory and a formation method thereof provided by the present disclosure are described below in detail with reference to the accompanying drawings.

Figure 1:
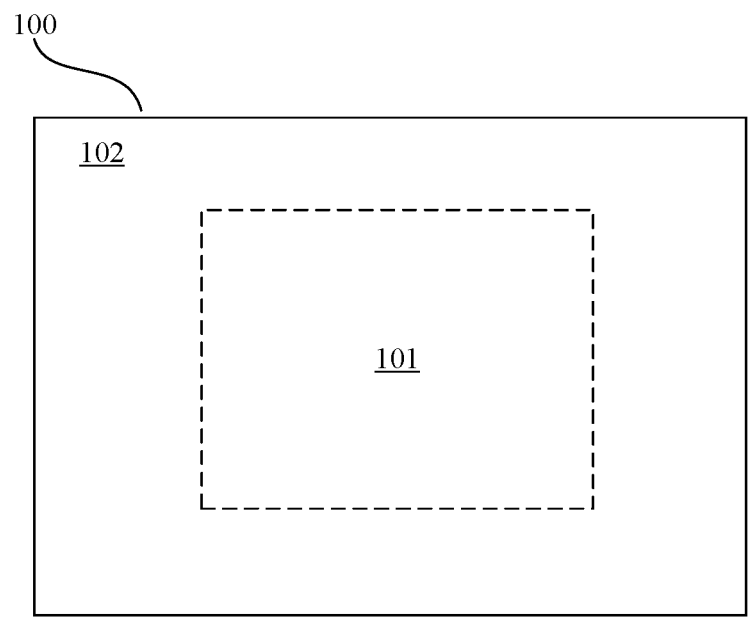
FIG. 1 is schematic structural diagram showing formation processes of a memory according to some embodiments.

With reference to FIG. 1, a schematic structural diagram showing formation processes of the memory according to one embodiment is illustrated.

With reference to FIG. 1, a substrate 100 is provided. The substrate 100 includes an array area 101 and a peripheral area 102 encircling the array area 101.

In the array area 101 there is an active area array for forming a memory, and in the peripheral area 102 there is a peripheral device (such as a logic control circuit or the like) for forming the memory.

Figure 2A:
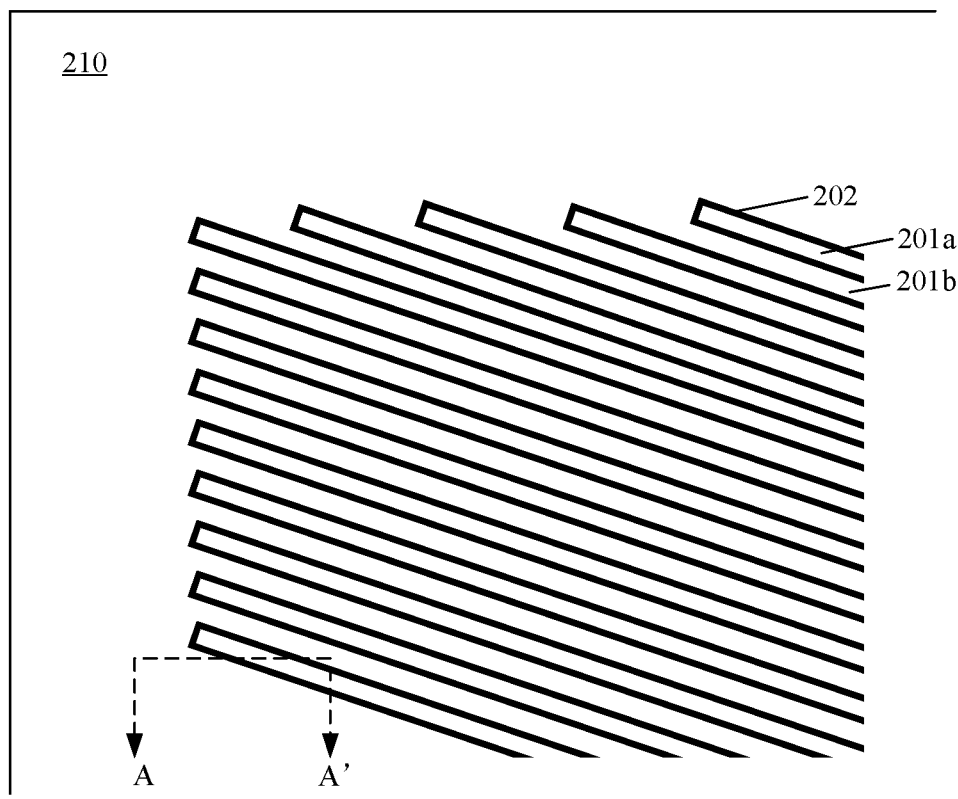
FIGS. 2a and 2b are schematic structural diagrams showing formation processes of a memory according to some embodiments.
Figure 2B:
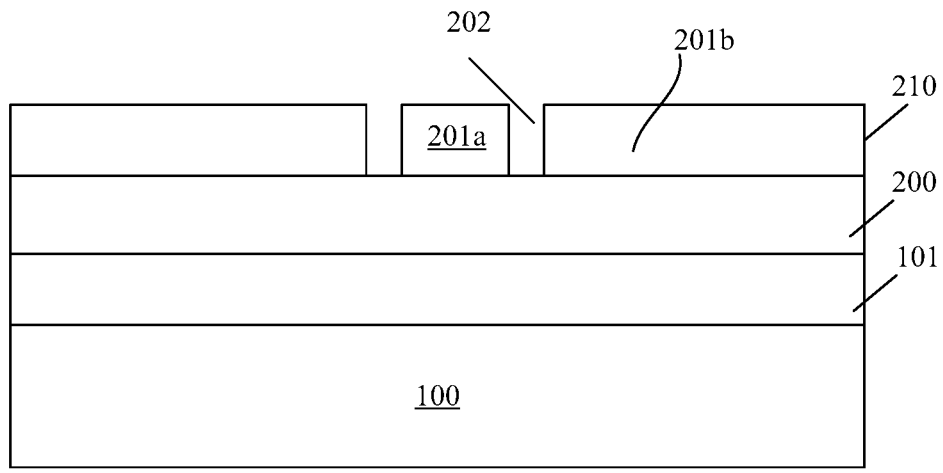

With reference to FIG. 2a and FIG. 2b, an unpatterned first mask layer 200 is formed on the substrate 100, and a third mask layer 210 is formed on the unpatterned first mask layer 200. In the third mask layer 210 there is formed a plurality of strip-shaped initial patterns arranged in parallel, including a strip-shaped pattern 201a and a strip-shaped pattern 201b. The strip-shaped initial pattern 201 is a covered pattern and is configured for forming, in the array area 101 of the substrate 100, a plurality of discrete and strip-shaped continuous active areas arranged in parallel. There is an opening 202 between the strip-shaped initial patterns 201a and 201b, which is configured for separating the strip-shaped initial patterns 201a and 201b. FIG. 2a is a schematic top view, and FIG. 2b is a schematic cross-sectional view along a secant line AA' in FIG. 2a. Before the first mask layer 200 is formed, a hard mask layer 101 or other buffer layers may also be formed on the surface of the substrate 100 to improve the pattern-transfer accuracy in subsequent etching processes.

The strip-shaped pattern is formed by using a double patterning method. In one embodiment, with reference to FIG. 3a to FIG. 3f, schematic structural diagrams showing a method for forming the first mask layer according to an embodiment of the present disclosure are illustrated.

Figure 3A:
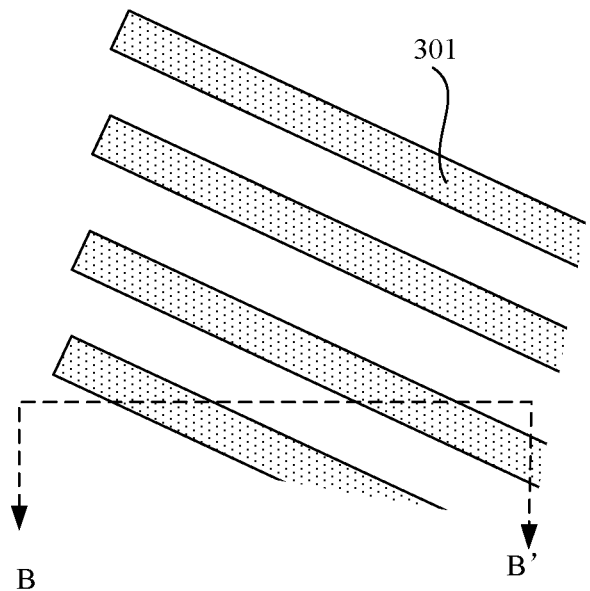
FIG. 3a-3f are schematic structural diagrams showing formation processes of a memory according to some embodiments.
Figure 3B:
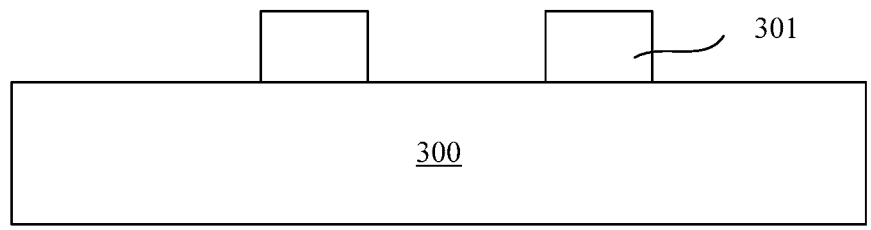

With reference to FIG. 3a and FIG. 3b, a mask pattern 301 is formed on the substrate 300. FIG. 3a is a schematic top view of the mask pattern 301, and FIG. 3b is a schematic cross-sectional view along the secant line BB' in FIG. 3a. The mask pattern 301 has strip-shaped patterns arranged in parallel. In this embodiment, the mask pattern 301 is arranged obliquely to increase an arrangement density of the discrete active areas formed subsequently. In other embodiments, the mask pattern 301 may also be arranged horizontally or vertically.

Figure 3C:
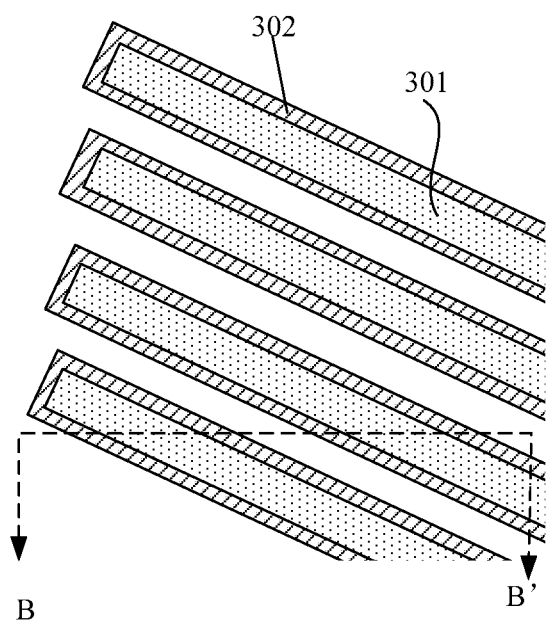
Figure 3D:
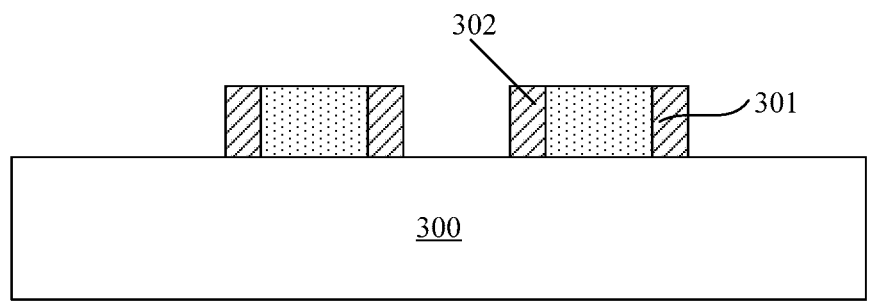

With reference to FIG. 3c and FIG. 3d, a sidewall 302 is formed on a sidewall of the mask pattern 301, and the sidewall 302 encircles the sidewall of the mask pattern 301.

Figure 3E:
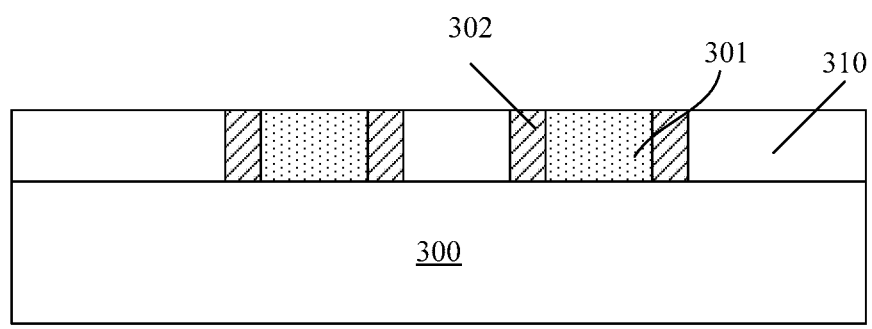

With reference to FIG. 3e, a first mask material 310 is filled and formed on the surface of the substrate 300, and the surface of the first mask material 310 is flush with the surface of the mask pattern 301.

Figure 3F:
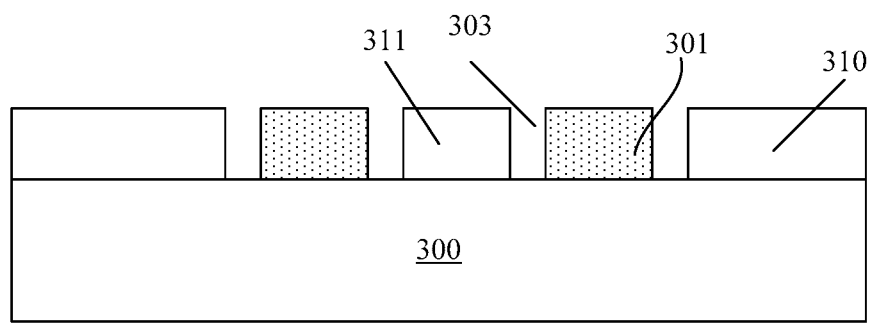

With reference to FIG. 3f, the sidewall 302 is removed to form an opening 303 (corresponding to the opening 202 in FIG. 2). The mask pattern 301 (corresponding to the strip-shaped initial pattern 201a in FIG. 2) and the mask pattern 311 (corresponding to the strip-shaped initial pattern 201b in FIG. 2) on two sides of the opening are used as strip-shaped patterns to define a width and a length of the continuous active area to be formed in the substrate subsequently. Through the above double patterning method, a spacing between adjacent strip-shaped patterns may be reduced, such that a density of the strip-shaped patterns can be increased.

Figure 4A:
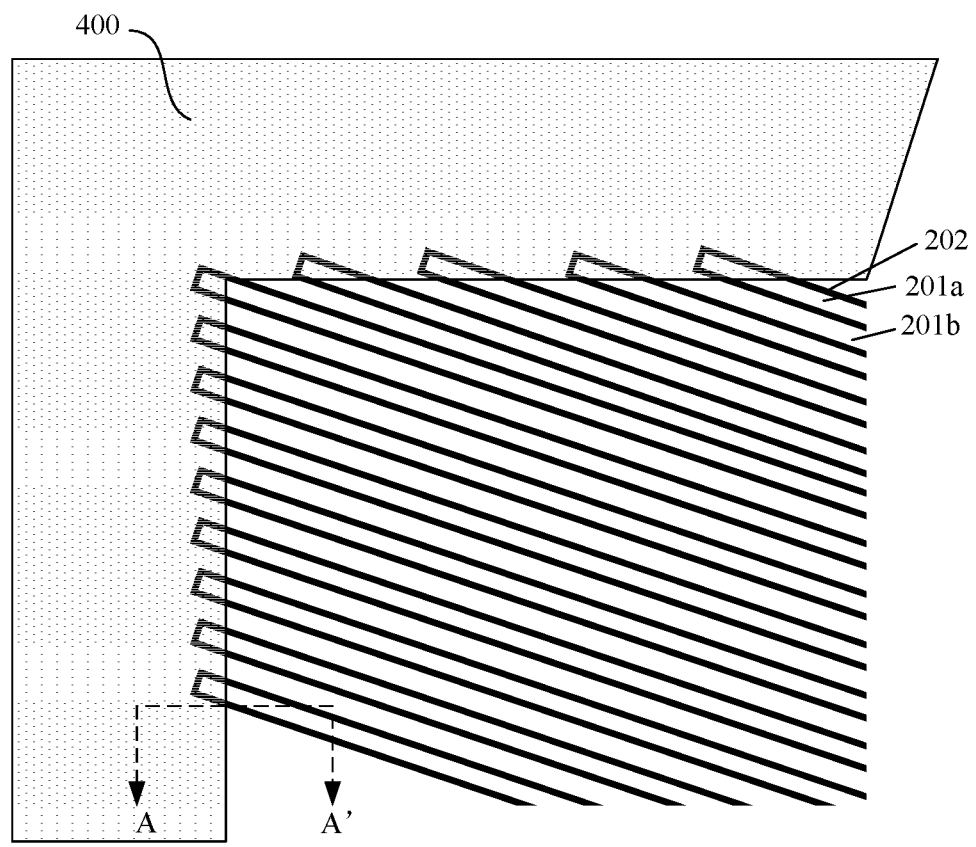
FIGS. 4a and 4b are schematic structural diagrams showing formation processes of a memory according to some embodiments.
Figure 4B:
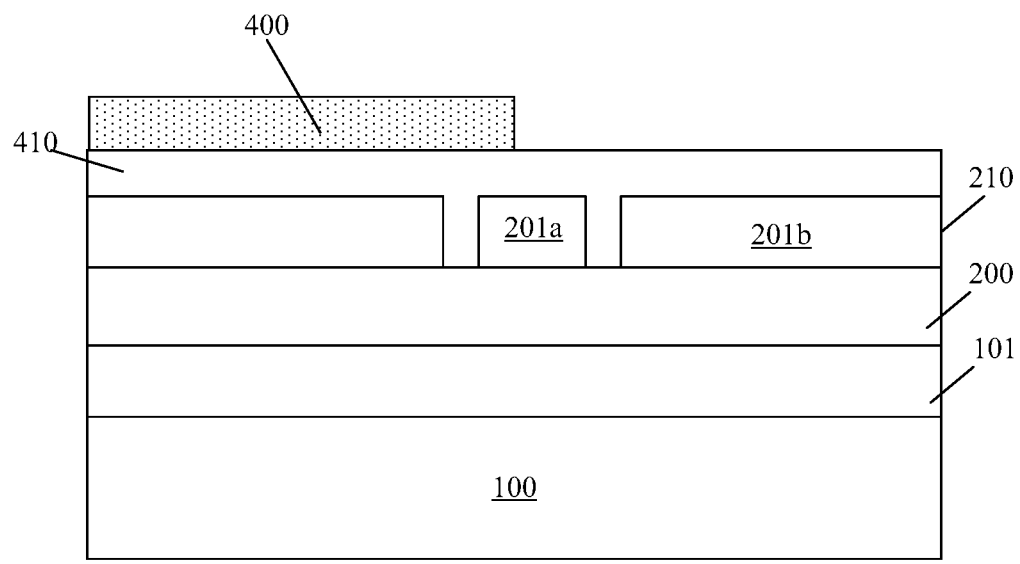

With reference to FIG. 4a and FIG. 4b, a patterned fourth mask layer 400 is formed on the patterned third mask layer 210, wherein the fourth mask layer 400 covers the peripheral area of the third mask layer 210 and covers ends of the strip-shaped initial patterns 201a and 201b. In this embodiment, there is a straight edge in a portion of the fourth mask layer 400 covering the ends of the strip-shaped initial patterns. Before forming the fourth mask layer 400, the formation method further includes forming a filling layer 410 that fills up the opening 202 in the third mask layer 210 and has a planar surface, wherein the fourth mask layer 400 is formed on the planar surface of the filling layer 410. A material of the filling layer 410 may be an organic anti-reflection layer, silicon oxide or the like.

Figure 5A:
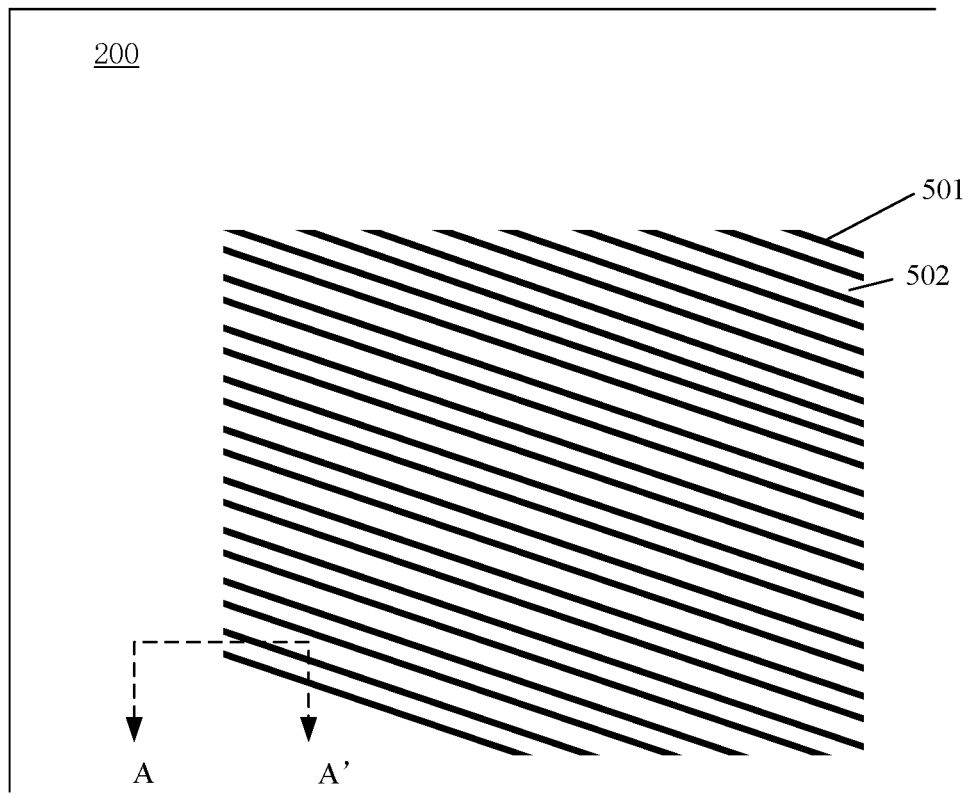
FIGS. 5a and 5b are schematic structural diagrams showing formation processes of a memory according to some embodiments.
Figure 5B:
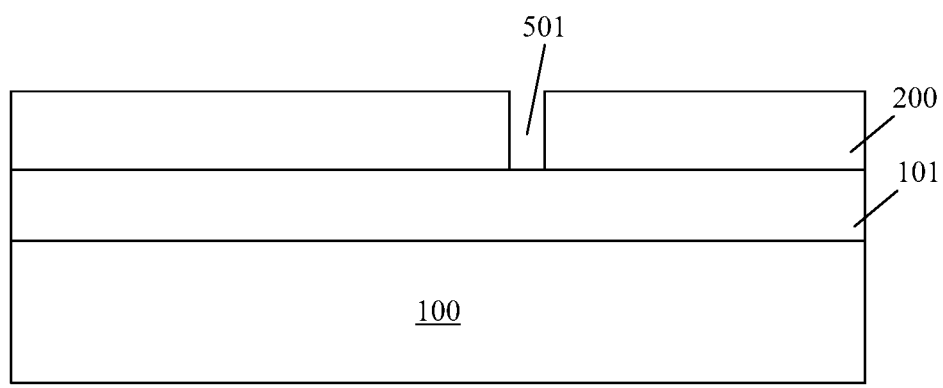

With reference to FIG. 5a and FIG. 5b, the first mask layer 200 is etched by using the fourth mask layer 400 (referring to FIG. 4a and FIG. 4b) and the third mask layer 210 (referring to FIG. 4a and FIG. 4b) as masks, and a strip-shaped pattern 502 is formed in the first mask layer 200, wherein an end of the strip-shaped pattern 502 is connected to the peripheral area of the first mask layer 200. There is an opening 501 between the adjacent strip-shaped patterns 502. Next, the third mask layer 210 and the fourth mask layer 400 are removed.

In the process of etching the first mask layer 200, in the third mask layer 210, the opening 202 at an end of the initial continuous active area 201a is covered by the fourth mask layer 400, so no pattern will be transferred into the first mask layer 200. Thereby, the ends of all the strip-shaped patterns 502 formed in the first mask layer 200 are connected to the peripheral area.

Figure 6:
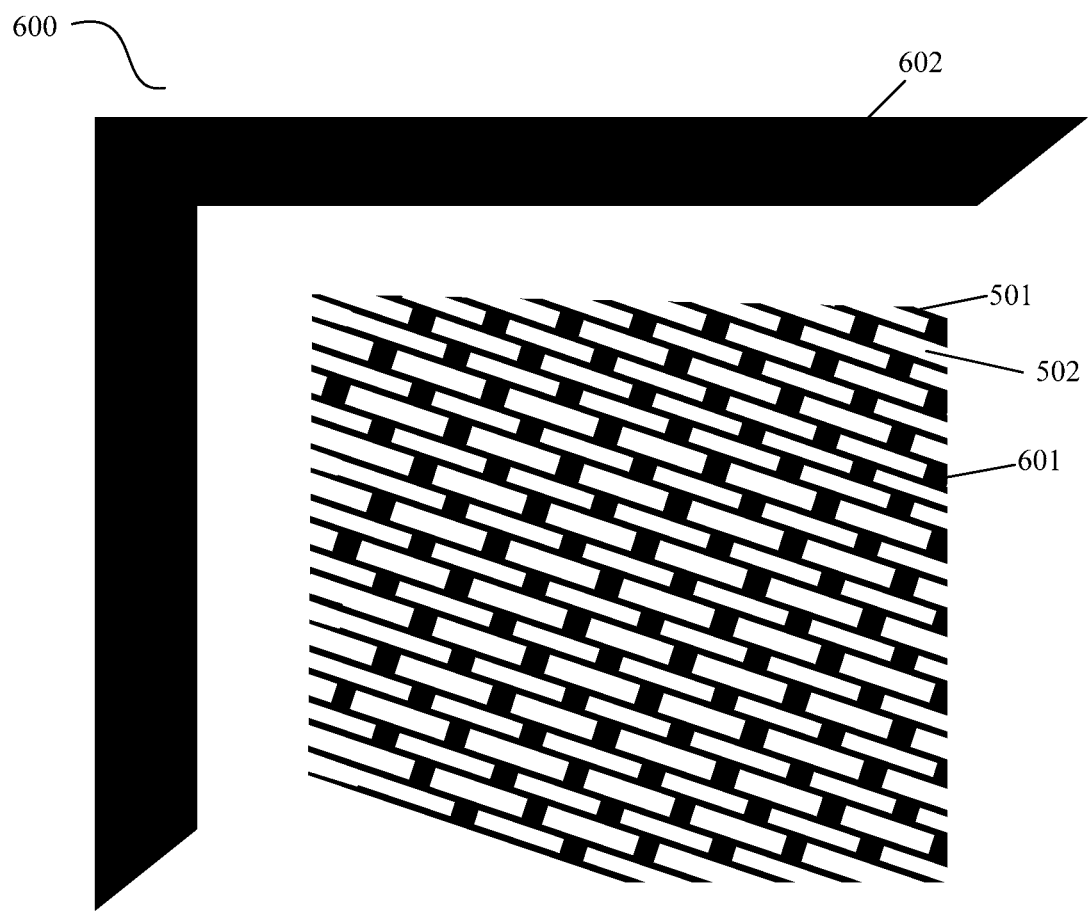
FIG. 6 is schematic structural diagram showing formation processes of a memory according to some embodiments.

With reference to FIG. 6, a second mask layer 600 is formed on the first mask layer 200, and in the second mask layer 600 there is formed a plurality of first patterns 601. The plurality of first patterns 601 are arranged in an array and are overlapped with the strip-shaped patterns 502 to form a division trench in the substrate 100 to divide the continuous active area into a plurality of discrete active areas.

In this embodiment, in the second mask layer 600 there is also formed a second pattern 602 positioned on the peripheral area of the substrate and encircling the strip-shaped patterns 502. There is a certain spacing between the second pattern 602 and the outermost first pattern 601. The second pattern 602 is configured for forming, in the peripheral area of the substrate, a peripheral trench encircling the array area.

In FIG. 6, only the first pattern 601 and the second pattern 602 in the second mask layer 600 are shown. The first pattern 601 and the second pattern 602 are both opening patterns, and the other areas are covered patterns (not shown in the figure).

The first pattern 601 is an opening pattern, and the strip-shaped patterns 502 are covered patterns. Therefore, after the substrate 100 is etched along the first pattern 601, a division trench is formed by severing the continuous active area for corresponding the strip-shaped patterns 502 in the substrate 100. In this embodiment, the third pattern 602 is also an opening pattern and is configured for forming a peripheral trench in the substrate.

To increase the storage density, the first patterns 601 are arranged in staggered rows, such that the discrete active areas formed after division are arranged in staggered rows to increase the number of active areas.

There is a certain spacing between the outermost first pattern 601 and the end of the strip-shaped pattern 502, to prevent the connection between the end of the continuous active area subsequently formed in the substrate and the peripheral area from being cut off.

Figure 7:
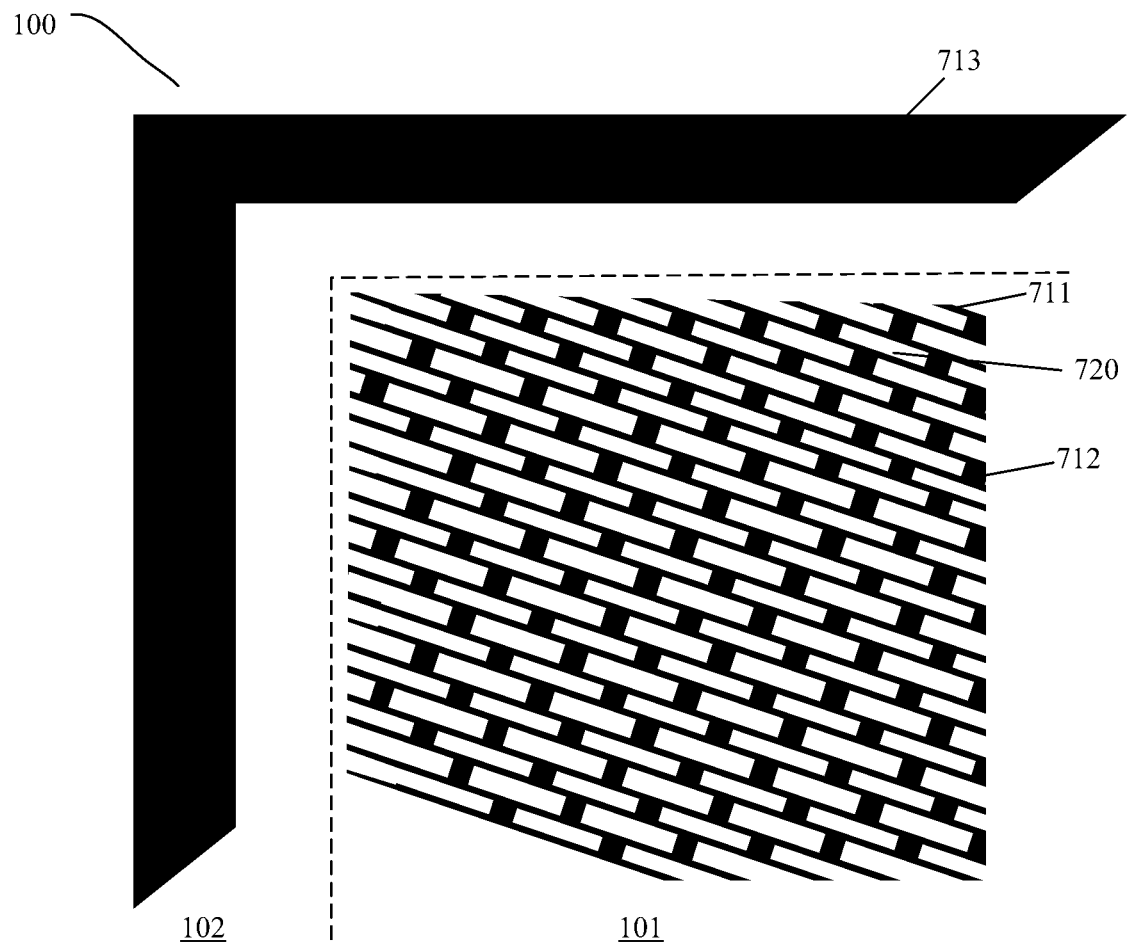
FIG. 7 is schematic structural diagram showing formation processes of a memory according to some embodiments.

With reference to FIG. 7, it is etched layer by layer in to the substrate 100 by using the first mask layer 200 and the second mask layer 600 as masks to transfer the strip-shaped patterns 502, the opening 501, the first pattern 601 and the second pattern 602 into the substrate 100 to form a division trench and a peripheral trench. The continuous active area is divided into a plurality of discrete active areas 720 arranged in an array, and an end of the discrete active area 720 at an edge of the array area is connected to the peripheral area 102 of the substrate 100. Next, an insulating material is filled in the division trench and the peripheral trench to form a shallow trench isolation structure. The discrete active area 720 at the edge of the array area is connected to the peripheral area 102 of the substrate, which not only can prevent this discrete active area 720 from collapsing due to a smaller size, but also can effectively release the stress applied by an isolation structure or a device in the peripheral area to the edge of the array area 101, thereby improving the edge problem of the array area.

The discrete active areas 720 are isolated by the shallow trench isolation structure. In this embodiment, the shallow trench isolation structure includes a strip-shaped first shallow trench isolation structure 711 and a block-shaped second shallow trench isolation structure 712. The array area 101 is divided by the first shallow trench isolation structure 711 into a plurality of strip-shaped continuous active areas arranged in parallel, and the strip-shaped continuous active area is divided by the second shallow trench isolation structure 712 into a plurality of discrete active areas 720. End surfaces of the first shallow trench isolation structure 711 on the same side of the array area are flush, which may reduce the stress effects.

The peripheral shallow trench isolation structure 713 corresponds to the second pattern 602 in the second mask layer 600 (referring to FIG. 6). The second shallow trench isolation structure 712 corresponds to the first pattern 601 in the second mask layer 600 (referring to FIG. 6). The first shallow trench isolation structure 711 corresponds to the opening 501 in the first mask layer 200 (referring to FIG. 5a).

In another embodiment, a side of the second pattern 602 in the second mask layer 600 facing toward the array area is a curve, such that a sidewall of the formed peripheral shallow trench isolation structure 713 facing toward the array area is a curved surface. In this way, the total length of the sidewalls can be increased, the stability can be enhanced, the stress generated by the peripheral shallow trench isolation structure 713 can be further relieved, and the stress effects on the discrete active area 720 at the edge of the array area can be reduced.

In the foregoing embodiments, the substrate is etched after forming multilayer mask layers having different patterns. In this way, a discrete active area array can be directly formed in the substrate.

In the embodiments of the present disclosure, there is also provided another method for forming a memory.

The method includes the following steps: providing a substrate, which includes an array area and a peripheral area encircling the array area; forming, in the array area of the substrate, a plurality of strip-shaped continuous active areas arranged in parallel, wherein an end of each of the continuous active areas is connected to the peripheral area of the substrate; and dividing the continuous active area into a plurality of discrete active areas, wherein the outermost discrete active area is connected to the peripheral area of the substrate.

The first mask layer 200 having the strip-shaped pattern 502 and the opening 501 as shown in FIG. 5a and FIG. 5b may be formed on the substrate, and then the substrate 100 is etched using the first mask layer 200 as a mask to form the strip-shaped continuous active areas in the substrate 100.

Next, after the first mask layer 200 is removed, the second mask layer 600 having the first pattern 601 and the second pattern 602 as shown in FIG. 6 is formed on the substrate, and then the substrate 100 is etched using the second mask layer 600 as a mask. Next, by transferring the first pattern 601 and the second pattern 602 into the substrate, the continuous active area in the substrate is divided, by the division trench, into a plurality of discrete active areas, and a peripheral trench is formed in the peripheral area. A sidewall of the peripheral trench facing toward a side of the array area may be a curved surface to reduce the stress effects and improve the stability.

Finally, an insulating material is filled in the division trench and the peripheral trench to form a shallow trench isolation structure.

In the process of forming the memory in this embodiment, the substrate is etched once every time a mask layer is formed, and an active area array is formed by etching the substrate several times.

An embodiment of the present disclosure also provides a memory formed in the above embodiments.

With reference to FIG. 7, a schematic structural diagram of a memory according to an embodiment of the present disclosure is illustrated.

The memory includes a substrate 100, which includes an array area 101 and a peripheral area 102 encircling the array area 101. A plurality of discrete active areas 720 arranged in an array are formed in the array area 101. An end of the discrete active area 720 at an edge of the array area is connected to the peripheral area 102 of the substrate 100. The discrete active areas 720 are isolated by a shallow trench isolation structure.

The shallow trench isolation structure includes a strip-shaped first shallow trench isolation structure 711 and a block-shaped second shallow trench isolation structure 712. The array area 101 is divided by the first shallow trench isolation structure 711 into a plurality of continuous active areas arranged in parallel, and the continuous active area is divided by the second shallow trench isolation structure 712 into a plurality of discrete active areas 720. End surfaces of the first shallow trench isolation structure 711 on the same side of the array area 101 are flush.

A peripheral shallow trench isolation structure 713 is formed in the peripheral area 102 of the substrate 100, and the peripheral shallow trench isolation structure 713 encircles the array area 101. Between the peripheral shallow trench isolation structure 713 and the array area 101 there is a certain spacing, which serves as an electrical isolation structure between the array area 101 of the substrate 100 and the peripheral area 102.

In this embodiment, a sidewall of the peripheral shallow trench isolation structure 713 facing toward a side of the array area 101 is a plane. In another embodiment, a sidewall of the peripheral shallow trench isolation structure 713 facing toward a side of the array area 101 is a curved surface to reduce the stress effects on the discrete active area 720 at the edge of the array area 101 and to improve the stability.

The discrete active area 720 at the edge of the active area array is connected to the peripheral area 102 of the substrate, which not only can prevent this discrete active area 720 from collapsing due to a smaller size, but also can effectively release the stress applied by an isolation structure or a device in the peripheral area to the edge of the array area 101, thereby improving the edge problem of the array area.

What is mentioned above merely refers to some embodiments of the present disclosure. It is to be pointed out that to those of ordinary skill in the art, various improvements and embellishments may be made without departing from the principle of the present disclosure, and these improvements and embellishments are also deemed to be within the scope of protection of the present disclosure.

What is claimed is:

1. A memory, comprising:
    a substrate, comprising an array area and a peripheral area encircling the array area; and
    a plurality of discrete active areas arranged in staggered rows and located in the array area; and, wherein
    a first-positioned discrete active area, in each row of a first plurality of adjacent rows, contacts the substrate of the peripheral area at a first side of the array area;
    a first-positioned discrete active area, in each row of a second plurality of adjacent rows, contacts the substrate of the peripheral area at a second side of the array area that intersects the first side of the array area; and
    the discrete active areas are separated from each other by a shallow trench isolation structure;
    wherein a last-positioned discrete active area, in each row of the first plurality of adjacent rows, contacts the substrate of the peripheral area; and
    a last-positioned discrete active area, in each row of the second plurality of adjacent rows, contacts the substrate of the peripheral area.

2. The memory according to claim 1, wherein
    the first-positioned discrete active area, in each row of the first plurality of adjacent rows, contacts only the substrate of the peripheral area at the first side of the array area; and
    the first-positioned discrete active area, in each row of the second plurality of adjacent rows, contacts only the substrate of the peripheral area at the second side of the array area.

3. The memory according to claim 1, wherein all first-positioned discrete active areas in the staggered rows contact the substrate of the peripheral area; and/or all last-positioned discrete active areas in the staggered rows contact the substrate of the peripheral area.

4. The memory according to claim 1, wherein:
    every first-positioned discrete active area at the first side of the array area has a substantially equal longitudinal length; and
    adjacent first-positioned discrete active areas at the second side of the array area have unequal longitudinal lengths.

5. The memory according to claim 4, wherein the first-positioned discrete active areas at the second side of the array area vary cyclically in longitudinal length.

6. The memory according to claim 1, wherein:
    each medially positioned discrete active area, that does not contact the substrate of the peripheral area, has a substantially equal longitudinal length; and
    in at least one row of the staggered rows, the first-positioned discrete active area has a shorter or longer longitudinal length than a medially positioned discrete active area that does not contact the substrate of the peripheral area.

7. The memory according to claim 1, wherein a peripheral shallow trench isolation structure is formed in the substrate of the peripheral area and encircles the array area, and the peripheral shallow trench isolation structure is separated from the array area by the substrate of the peripheral area.

8. The memory according to claim 7, wherein a sidewall of the peripheral shallow trench isolation structure facing toward a side of the array area is a curved surface.

9. The memory according to claim 7, wherein each sidewall of the peripheral shallow trench isolation structure facing toward a respective side of the array area is a curved surface.

10. The memory according to claim 1, wherein the shallow trench isolation structure comprises a plurality of parallel strip-shaped first shallow trench isolation structures and a plurality of staggered block-shaped second shallow trench isolation structures, the array area being divided by the plurality of first shallow trench isolation structures into a plurality of strip-shaped continuous active areas arranged in parallel, and the plurality of strip-shaped continuous active areas being divided by the plurality of second shallow trench isolation structures into the plurality of discrete active areas.

11. The memory according to claim 10, wherein end surfaces of the first shallow trench isolation structures on a same side of the array area are flush with each other.

12. The memory according to claim 10, wherein:
    each of the first shallow trench isolation structures contacts the substrate of the peripheral area; and none of the second shallow trench isolation structures contacts the substrate of the peripheral area.

* * * * *